(12) United States Patent
Huang et al.

(10) Patent No.: US 11,495,631 B2
(45) Date of Patent: Nov. 8, 2022

(54) PIN MESA DIODES WITH OVER-CURRENT PROTECTION

(71) Applicant: Sensors Unlimited, Inc., Princeton, NJ (US)

(72) Inventors: Wei Huang, Plainsborough, NJ (US); Douglas Stewart Malchow, Lawrence, NJ (US); Michael J. Evans, Yardley, PA (US); John Liobe, New York, NY (US); Wei Zhang, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 156 days.

(21) Appl. No.: 16/785,098

(22) Filed: Feb. 7, 2020

(65) Prior Publication Data
US 2021/0249462 A1  Aug. 12, 2021

(51) Int. Cl.
*H01L 27/146* (2006.01)

(52) U.S. Cl.
CPC .. *H01L 27/14636* (2013.01); *H01L 27/14634* (2013.01); *H01L 27/14683* (2013.01); *H01L 27/14649* (2013.01)

(58) Field of Classification Search
CPC ......... H01L 27/14636; H01L 27/14634; H01L 27/14683; H01L 27/14649; H01L 27/14601; H01L 27/1446; H01L 27/14607; H01L 27/14629; H01L 31/105
See application file for complete search history.

(56) References Cited

U.S. PATENT DOCUMENTS

| 6,232,626 | B1 | 5/2001 | Rhodes |
| 6,680,495 | B2* | 1/2004 | Fitzergald ............... H01L 27/15 257/183 |
| 6,730,980 | B2 | 5/2004 | Rhodes |
| 7,129,556 | B2 | 10/2006 | Kwon |
| 2003/0183896 | A1* | 10/2003 | Nagata ................. H01L 31/105 257/461 |
| 2004/0113220 | A1* | 6/2004 | Rieve ................ H01L 27/14689 257/432 |
| 2014/0197373 | A1 | 7/2014 | Iguchi et al. |
| 2015/0357361 | A1* | 12/2015 | Kajiyama ......... H01L 27/14649 257/440 |
| 2016/0380017 | A1* | 12/2016 | Marion ............. H01L 27/14698 438/80 |
| 2019/0296058 | A1 | 9/2019 | Huang et al. |

FOREIGN PATENT DOCUMENTS

JP  2005197468 A  7/2005

OTHER PUBLICATIONS

Extended European Search Report dated May 14, 2021, issued during the prosecution of European Patent Application No. EP 21155753.3.

* cited by examiner

*Primary Examiner* — Nilufa Rahim
(74) *Attorney, Agent, or Firm* — Locke Lord LLP; Joshua L. Jones; Scott D. Wofsy

(57) ABSTRACT

A system includes a pixel including a diffusion layer in contact with an absorption layer. The diffusion layer and absorption layer are in contact with one another along an interface that is inside of a mesa. A trench is defined in the absorption layer surrounding the mesa. An overflow contact is seated in the trench.

15 Claims, 2 Drawing Sheets

PIN MESA DIODES WITH OVER-CURRENT PROTECTION

BACKGROUND

1. Field

The present disclosure relates to diodes, and more particularly to photodiodes such as used in pixels for imaging.

2. Description of Related Art

The lower the dark current of photodiodes in an imaging device, the better is the image quality. Similarly, the higher the sensitivity of photodiodes in imaging devices, the better is the image quality. At high light levels, the excess photons generate high current, which may damage a detector and/or put more stress on the read-out integrated circuit (ROIC). A photodetector array (PDA) with mesa structures improve modulation transfer function (MTF) of an imaging device.

The conventional techniques have been considered satisfactory for their intended purpose. However, there is an ever present need for improved systems and methods for photodiodes used in imaging devices. This disclosure provides a solution for this need.

SUMMARY

A system includes a pixel including a diffusion layer in contact with an absorption layer. The diffusion layer and absorption layer are in contact with one another along an interface that is inside of a mesa. A trench is defined in the cap layer and absorption layer surrounding the mesa. An overflow contact is seated in the trench.

The overflow contact can surround the mesa. The pixel can be one of a plurality of similar pixels arranged in a grid pattern, wherein the trench separates each pixel from adjacent ones of the pixels. The overflow contact can be seated in a base of the trench, forming an overflow contact grid wherein the pixels are in the spaces of the overflow contact grid between intersecting lines of the overflow contact grid.

The trench can have a base between sidewalls of the trench, wherein the overflow contact is seated on the base, and wherein there is lateral clearance on the base between the overflow contact and each of the sidewalls. The overflow contact can seat against a transparent conductive oxide (TCO) that in turn contacts the absorption layer. The TCO can include multiple layers of ZnO, $TiO_2$ and/or Indium Tin Oxide (ITO). The TCO can be formed in a gap within a SiNx layer. A contact metal can be electrically connected to the diffusion layer, configured to electrically connect the diffusion layer to a read-out integrated circuit (ROIC).

The overflow contact can be metallic. A cap layer can be deposited on the absorption layer opposite a substrate. The cap layer can include InP. A SiNx layer can be included over the cap layer. The SiNx layer can directly contact the absorption layer within the trench. An anti-reflective layer can be deposited on the substrate opposite the absorption layer. The absorption layer can include InGaAs, wherein the pixel is sensitive to illumination in infrared wavelengths. It is also contemplated that the absorption layer can include Si, wherein the pixel is sensitive to illumination in visible light wavelengths.

A method includes forming a trench in an absorption layer of a pixel array, wherein the trench is formed in a grid pattern surrounding respective pixels of the pixel array, wherein each pixel is surrounded the intersecting lines of the grid. The method includes forming an overflow contact in the trench, following the grid pattern.

The method can include depositing a SiNx layer on the absorption layer after forming the trench, wherein forming the overflow contact in the trench is performed after depositing the SiNx layer. Forming the overflow contact in the trench can include forming the overflow contact on a transparent oxide layer (TCO) formed in a gap in the SiNx layer.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
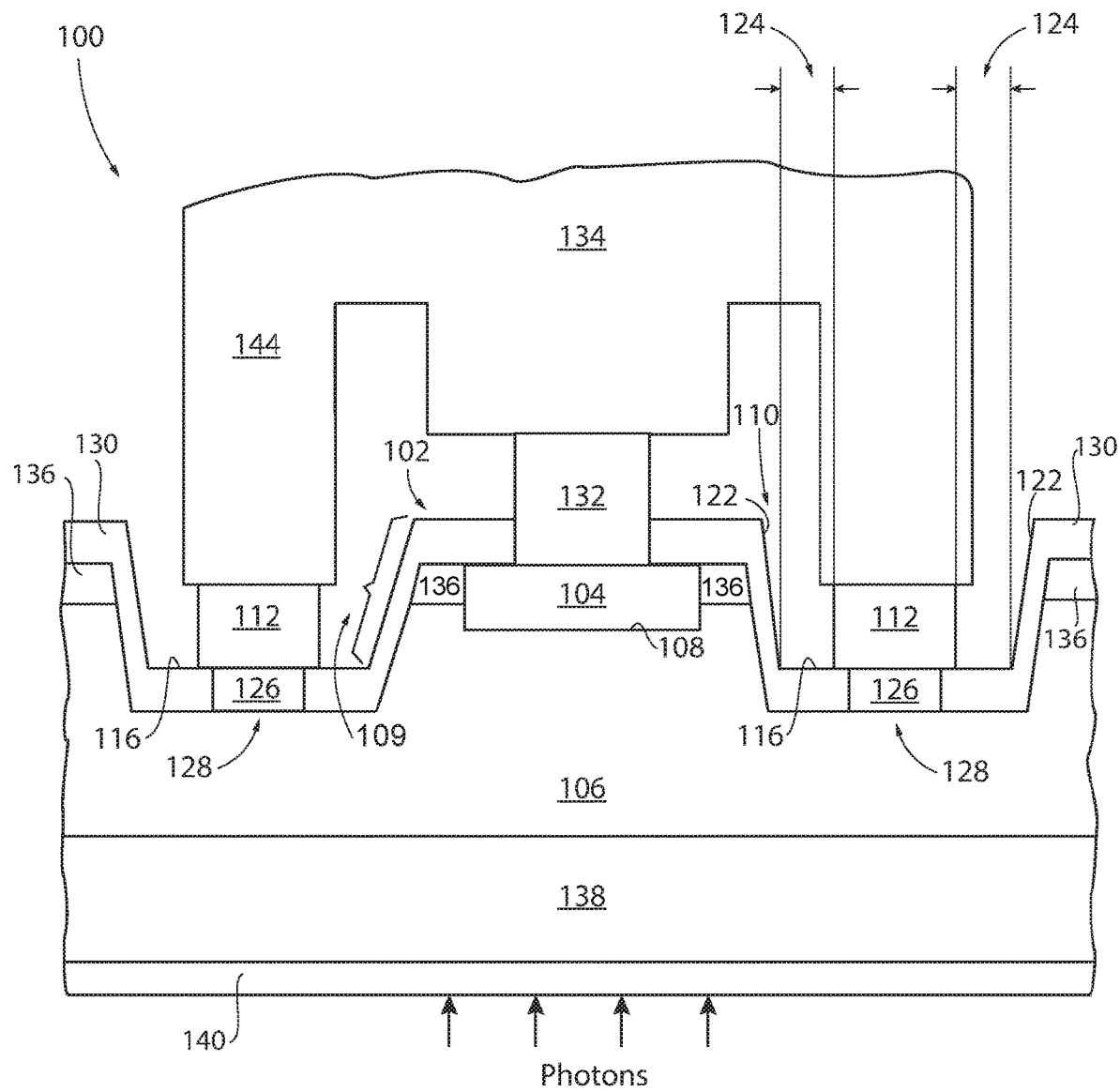
FIG. 1 is a schematic cross-sectional elevation view of an embodiment of a system constructed in accordance with the present disclosure, showing the mesa and trench.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIG. 2, as will be described. The systems and methods described herein can be used to reduce excess current, increase sensitivity, and reduce stress on read-out integrated circuits (ROICs) in imaging devices.

The system 100 includes a pixel 102 including a diffusion layer 104 in contact with an absorption layer 106. The diffusion layer 104 and absorption layer 106 are in contact with one another along an interface 108 that is inside of a mesa 109. A trench 110 is defined in the absorption layer 106 surrounding the mesa 109. An overflow contact 112 is seated in the trench 110.

Figure 2:
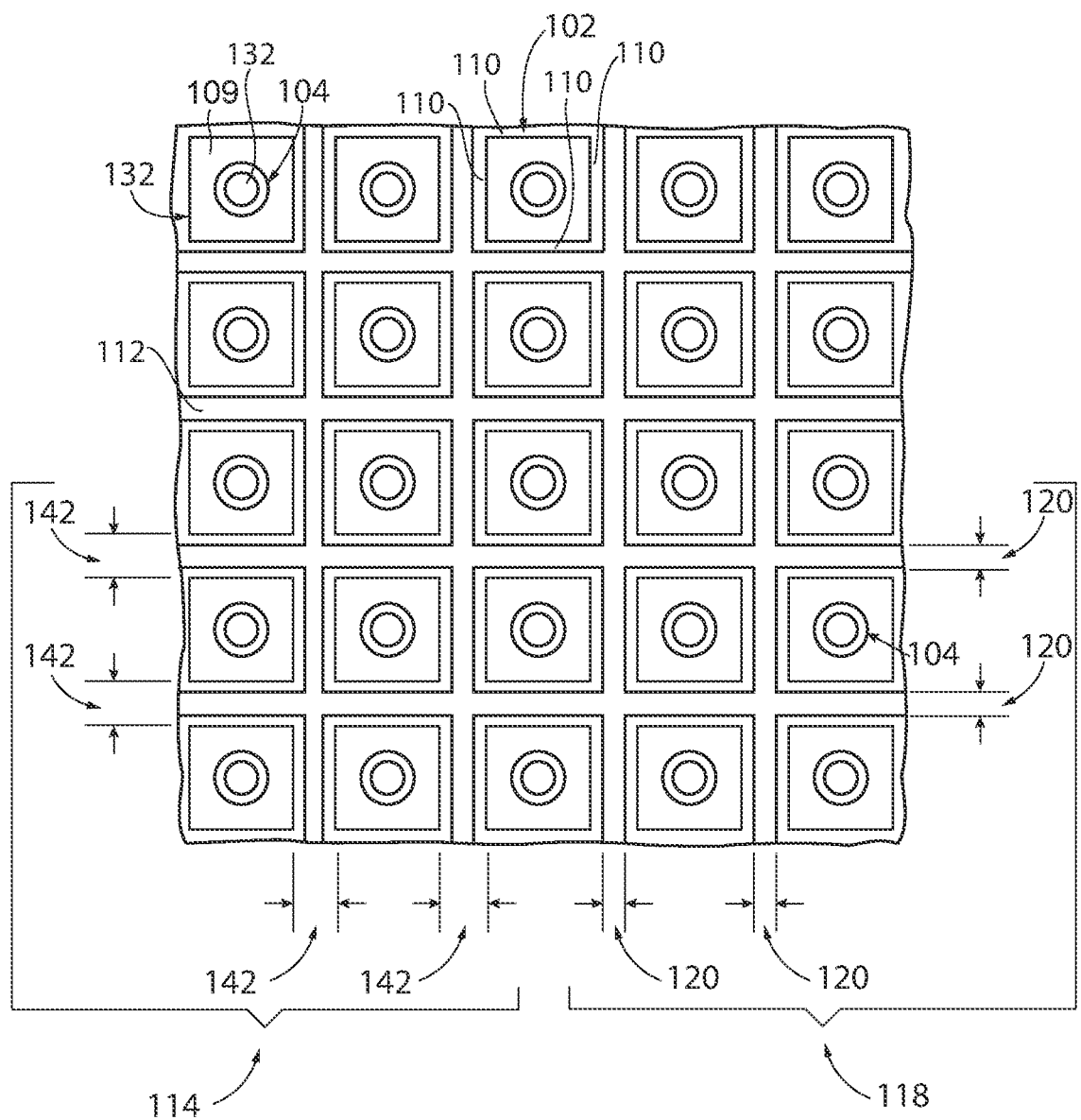
FIG. 2 is a schematic plan view of the system of FIG. 1, showing the grid pattern for a plurality of pixels.

With reference now to FIG. 2, the pixel 102 is one of a plurality of similar pixels 102 arranged in a square tiled grid pattern 114, a portion of which is indicated with reference character 114 and the associated phantom lines in FIG. 2. The trench 110 separates each pixel 102 from adjacent ones of the pixels 102. The overflow contact 112 surrounds each mesa 109. The overflow contact 112 is seated in a base 116 of the trench 110 (as identified in FIG. 1), forming an overflow contact grid 118. A portion of the overflow contact grid 118 is indicated in FIG. 2 with reference character 118 and the associated phantom lines. The pixels 102 are in the spaces of the overflow contact grid 118 between intersecting lines 120 of the overflow contact grid 118.

Referring again to FIG. 1, the base 116 of the trench 110 is located between sidewalls 122 of the trench 110. The overflow contact 112 is seated on the base 116 and there is lateral clearance 124 on the base 116 between the overflow contact 112 and each of the sidewalls 122. The overflow contact seats against a transparent conductive oxide (TCO) 126 that in turn contacts the absorption layer 106. The TCO 126 can include multiple layers of ZnO, TiO$_2$ and/or Indium Tin Oxide (ITO). The film resistivity of the TCO 126 can be designed based on detector working conditions, which can be implemented by adjusting the doping level of the TCO 126. The TCO 126 is formed in a gap 128 within a SiNx layer 130. For each pixel 102 (e.g. as shown in FIG. 2), a contact metal 132 electrically connects between the diffusion layer 104 and a read-out integrated circuit (ROIC) 134. The TCO 126 normally acts as an insulator, but when current reaches a predetermined maximum level, the resistance barrier of the TCO 126 breaks and excess current can flow through the TCO to a common current sink 144 on the ROIC 134.

The overflow contact 112 can be metallic. A cap layer 136, e.g. of InP, can be deposited on the absorption layer opposite a substrate 138, which can be of InP or any other suitable material. The SiNx layer 130 is included, located over the cap layer. The SiNx layer 130 directly contacts the absorption layer 106 within the trench 110. An anti-reflective layer 140 can optionally be deposited on the substrate 138 opposite the absorption layer 106. The absorption layer 106 can include InGaAs, e.g. making the pixel 102 sensitive to illumination in infrared wavelengths. It is also contemplated that the absorption layer 106 can include Si, e.g. making the pixel 102 is sensitive to illumination in visible light wavelengths. Those skilled in the art will readily appreciate that any other suitable material can be used to provide sensitivity in any other suitable wavelengths.

A method includes forming a trench, e.g. trench 110, in an absorption layer, e.g. absorption layer 106, of a pixel array (e.g. the array of pixels 102 of the square tiled grid pattern 114 in FIG. 2). The trench is formed in a grid pattern, e.g., grid pattern 114 of FIG. 2) surrounding respective pixels of the pixel array, wherein each pixel is surrounded by the intersecting lines of the grid (e.g. grid lines 142 of FIG. 2). The method includes forming an overflow contact, e.g., overflow contact 112, in the trench, following the grid pattern. The method can include depositing a SiNx layer, e.g. SiNx layer 130) on the absorption layer after forming the trench, wherein forming the overflow contact in the trench is performed after depositing the SiNx layer. Forming the overflow contact in the trench can include forming the overflow contact on a transparent oxide layer (TCO), e.g., TCO 126, formed in a gap, e.g. gap 128, in the SiNx layer. The diffusion layer 104 is the P portion of a PIN diode, the absorption layer 106 is the I portion of the PIN diode, and the substrate 138 is the N portion of the PIN diode.

The methods and systems of the present disclosure, as described above and shown in the drawings, provide for reduced excess current, increased sensitivity, and reduced stress on read-out integrated circuits (ROICs) in imaging devices. This can improve image quality and can reduce ROIC design requirements and signal processing complications relative to traditional configurations. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
    a pixel including a diffusion layer in contact with an absorption layer, wherein the diffusion layer and absorption layer are in contact with one another along an interface that is inside of a mesa;
    a trench defined in the absorption layer surrounding the mesa; and
    an overflow contact seated in the trench, wherein the trench has a base between sidewalls of the trench, wherein the overflow contact is seated on the base, wherein there is lateral clearance on the base between the overflow contact and each of the sidewalls, and wherein the overflow contact seats against a transparent conductive oxide (TCO) that in turn contacts the absorption layer. wherein the TCO is within in the SiNx layer within the trench.

2. The system as recited in claim 1, wherein the overflow contact surrounds the mesa.

3. A system as recited in claim 1, wherein the pixel is one of a plurality of similar pixels arranged in a grid pattern, wherein the trench separates each pixel from adjacent ones of the pixels, and wherein the overflow contact is seated in a base of the trench, forming an overflow contact grid wherein the pixels are in the spaces of the overflow contact grid between intersecting lines of the overflow contact grid.

4. The system as recited in claim 1, wherein the overflow contact is metallic.

5. The system as recited in claim 1, further comprising a cap layer deposited on the absorption layer opposite a substrate.

6. The system as recited in claim 5, wherein the cap layer includes InP.

7. The system as recited in claim 5, further comprising a SiNx layer over the cap layer.

8. The system as recited in claim 7, wherein the SiNx layer directly contacts the absorption layer within the trench.

9. The system as recited in claim 5, further comprising an anti-reflective layer deposited on the substrate opposite the absorption layer.

10. The system as recited in claim 1, further comprising a contact metal electrically connected to the diffusion layer, configured to electrically connect the diffusion layer to a read-out integrated circuit (ROIC).

11. The system as recited in claim 10, further comprising the ROIC connected in electrical communication with the contact metal.

12. The system as recited in claim 1, wherein the TCO includes at least one of multiple layers of ZnO, TiO$_2$, Indium Tin Oxide (ITO), or combinations of layers of ZnO, TiO$_2$, and ITO.

13. The system as recited in claim 10, wherein the TCO is formed in a gap within a SiNx layer.

14. The system as recited in claim 1, wherein the absorption layer includes InGaAs, and wherein the pixel is sensitive to illumination in infrared wavelengths.

15. The system as recited in claim 1, wherein the absorption layer includes Si, and wherein the pixel is sensitive to illumination in visible light wavelengths.

* * * * *